United States Patent
Lee et al.

(10) Patent No.: US 11,711,091 B2
(45) Date of Patent: Jul. 25, 2023

(54) ANALOG-TO-DIGITAL CONVERTER

(71) Applicant: SAMSUNG ELECTRONICS CO., LTD., Suwon-si (KR)

(72) Inventors: Jaerin Lee, Yongin-si (KR); Minjae Lee, Gwangju (KR); Hyungyu Ju, Daejeon (KR); Kyeongkeun Kang, Suwon-si (KR)

(73) Assignees: SAMSUNG ELECTRONICS CO., LTD., Suwon-si (KR); GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 17/675,060

(22) Filed: Feb. 18, 2022

(65) Prior Publication Data

US 2022/0407534 A1    Dec. 22, 2022

(30) Foreign Application Priority Data

Jun. 17, 2021    (KR) .................. 10-2021-0078589

(51) Int. Cl.
| | |
|---|---|
| *H03M 1/12* | (2006.01) |
| *H03M 1/50* | (2006.01) |
| *H03M 1/46* | (2006.01) |

(52) U.S. Cl.
CPC ......... *H03M 1/1245* (2013.01); *H03M 1/466* (2013.01); *H03M 1/50* (2013.01)

(58) Field of Classification Search
CPC ...... H03M 1/1245; H03M 1/466; H03M 1/50; H03M 1/462; H03M 1/468; H03M 1/804; H03M 1/124

(Continued)

(56) References Cited

U.S. PATENT DOCUMENTS

| 6,909,391 B2 | 6/2005 | Rossi |
| 8,492,697 B2 | 7/2013 | Neubauer et al. |

(Continued)

FOREIGN PATENT DOCUMENTS

| JP | 3130007 B2 | 1/2001 |
| JP | 5659950 B2 | 1/2015 |

(Continued)

OTHER PUBLICATIONS

Ewout Martens et al., "A 69-dB SNDR 300-MS/s Two-Time Interleaved Pipelined SAR ADC in 16-nm CMOS FinFET With Capacitive Reference Stabilization", IEEE Journal of Solid-State Circuits, vol. 53, Issue 4, DOI: 10.1109/JSSC.2017.2784762, Feb. 2018, 12 pages total.

(Continued)

*Primary Examiner* — Jean B Jeanglaude
(74) *Attorney, Agent, or Firm* — Sughrue Mion, PLLC

(57) ABSTRACT

An analog-to-digital converter, including a sample/hold circuit; a reference voltage driver; a digital-to-analog converter; a comparator; and a logic circuit, wherein the reference voltage driver includes: a first voltage supplier circuit configured to output an external supply voltage provided from outside of the analog-to-digital converter; a second voltage supplier circuit configured to output a sampled reference voltage that is obtained during a sampling phase based on control signals received from the logic circuit; and a switching driver configured to electrically connect the first voltage supplier circuit to the digital-to-analog converter during a first conversion phase after the sampling phase based on the control signals received from the logic circuit, and to electrically connect the second voltage supplier circuit to the digital-to-analog converter during a second conversion phase based on the control signals received from the logic circuit.

20 Claims, 17 Drawing Sheets

(58) Field of Classification Search
USPC .......................................................... 341/155
See application file for complete search history.

(56) References Cited

U.S. PATENT DOCUMENTS

| | | | |
|---|---|---|---|
| 9,503,117 B2 | 11/2016 | Lee et al. | |
| 10,103,742 B1* | 10/2018 | Guo | ...................... H03M 1/145 |
| 10,630,304 B1* | 4/2020 | Trivedi | ................. H03M 1/662 |
| 2008/0018514 A1* | 1/2008 | Ryu | ........................ H03M 1/06 |
| | | | 341/172 |

FOREIGN PATENT DOCUMENTS

| | | |
|---|---|---|
| KR | 10-1823435 B1 | 1/2018 |
| KR | 10-1833923 B1 | 3/2018 |

OTHER PUBLICATIONS

Junhua Shen et al., "A 16-bit 16-MS/s SAR ADC With On-Chip Calibration in 55-nm CMOS", IEEE Journal of Solid-State Circuits, vol. 53, Issue 4, DOI: 10.1109/JSSC.2017.2784761, Jan. 2018, 13 pages total.

Maoqiang Liu et al., "A 10-b 20-MS/s SAR ADC With DAC-Compensated Discrete-Time Reference Driver", IEEE Journal of Solid-State Circuits, vol. 54, Issue 2, DOI: 10.1109/JSSC2018.2873711, Oct. 2018, 12 pages total.

Hyungyu Ju et al., "A 12-bit 40-MS/s SAR ADC with Calibration-Less Switched Capacitive Reference Driver", Electronics, 9, 1854, doi: 10.3390/electronics9111854, Nov. 2020, 15 pages total.

* cited by examiner

ANALOG-TO-DIGITAL CONVERTER

CROSS-REFERENCE TO RELATED APPLICATION

This application is based on and claims priority under 35 U.S.C. § 119 to Korean Patent Application No. 10-2021-0078589, filed on Jun. 17, 2021, in the Korean Intellectual Property Office, the disclosure of which is incorporated by reference herein in its entirety.

BACKGROUND

1. Field

The disclosure relates to an electronic device, and more particularly, to an analog-to-digital converter.

2. Description of Related Art

With the progress of developments of digital logic circuits, the characteristics of digital logic circuits, such as an increase in the speed of digital logic circuits and a decrease in the power consumption of digital logic circuits, have been enhanced. Therefore, there has been active research into successive-approximation-register analog-to-digital converters including a digital circuit. However, high-resolution successive-approximation-register analog-to-digital converters may have limited performance because of the noise of a comparator, switch noise of a digital-to-analog converter, or the like.

SUMMARY

Provided are an analog-to-digital converter configured to switch a voltage supplied as a reference voltage during a conversion phase.

Additional aspects will be set forth in part in the description which follows and, in part, will be apparent from the description, or may be learned by practice of the presented embodiments.

In accordance with an aspect of the disclosure, an analog-to-digital converter includes a sample/hold circuit; a reference voltage driver; a digital-to-analog converter; a comparator; and a logic circuit, wherein the reference voltage driver includes: a first voltage supplier circuit configured to output an external supply voltage provided from outside of the analog-to-digital converter; a second voltage supplier circuit configured to output a sampled reference voltage that is obtained during a sampling phase based on control signals received from the logic circuit; and a switching driver configured to electrically connect the first voltage supplier circuit to the digital-to-analog converter during a first conversion phase after the sampling phase based on the control signals received from the logic circuit, and to electrically connect the second voltage supplier circuit to the digital-to-analog converter during a second conversion phase based on the control signals received from the logic circuit.

In accordance with an aspect of the disclosure, an analog-to-digital converter includes a sample/hold circuit configured to sample a first input voltage and a second input voltage based on a sample/hold control signal; a reference voltage driver configured to output a reference voltage; a digital-to-analog converter configured to, based a conversion control signal, output a first comparison voltage based on a sampled first input voltage and the reference voltage, and output a second comparison voltage based on a sampled second input voltage and the reference voltage; a comparator configured to compare the first comparison voltage with the second comparison voltage based on a comparison control signal, and to output a comparison result voltage and a comparison completion signal; and a logic circuit configured to output the sample/hold control signal, a switching control signal, the conversion control signal, and the comparison control signal, and to output a digital signal based on the comparison result voltage, wherein the switching control signal has a first logic level during a sampling phase and a first conversion phase and a second logic level during a second conversion phase that occurs after the first conversion phase, wherein the reference voltage driver is further configured to output the reference voltage to the digital-to-analog converter as one from among a sampled reference voltage or a supply voltage, based on a logic level of the switching control signal, and wherein the sampled reference voltage is obtained during the sampling phase, and the supply voltage is provided from an outside of the analog-to-digital converter.

In accordance with an aspect of the disclosure, an analog-to-digital converter includes a sample/hold circuit; a reference voltage driver; a digital-to-analog converter; a comparator; and a logic circuit, wherein the logic circuit is configured to output a switching control signal having a turn-off level during a first conversion phase that occurs after a sampling phase, and to output the switching control signal having a turn-on level during a second conversion phase that occurs after the first conversion phase, and wherein the reference voltage driver includes: a first transistor configured to transmit an external supply voltage to a node based on a comparison result voltage output from the comparator, the node being connected to the digital-to-analog converter; a second transistor configured to electrically connect the first transistor to the node based on the switching control signal; a third transistor configured to transmit a sampled reference voltage to the node based on the comparison result voltage, the sampled reference voltage being obtained during the sampling phase; a fourth transistor configured to electrically connect the third transistor to the node based on an inverted switching control signal; a fifth transistor configured to transmit a ground voltage to the node in based on comparison result voltage; and an inverter configured to receive the switching control signal and output the inverted switching control signal.

In accordance with an aspect of the disclosure, an analog-to-digital converter includes a digital-to-analog converter; a logic circuit; and a reference voltage driver, wherein the reference voltage driver includes: a first voltage supplier circuit configured to output an external supply voltage; a second voltage supplier circuit configured to output a sampled reference voltage that is obtained during a sampling phase based on control signals received from the logic circuit; and a switching driver configured to: provide the external supply voltage from the first voltage supplier circuit to the digital-to-analog converter during a first conversion phase after the sampling phase based on the control signals received from the logic circuit, and provide the sampled reference voltage from the second voltage supplier circuit to the digital-to-analog converter during a second conversion phase based on the control signals received from the logic circuit.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION OF THE EMBODIMENTS

Figure 1:
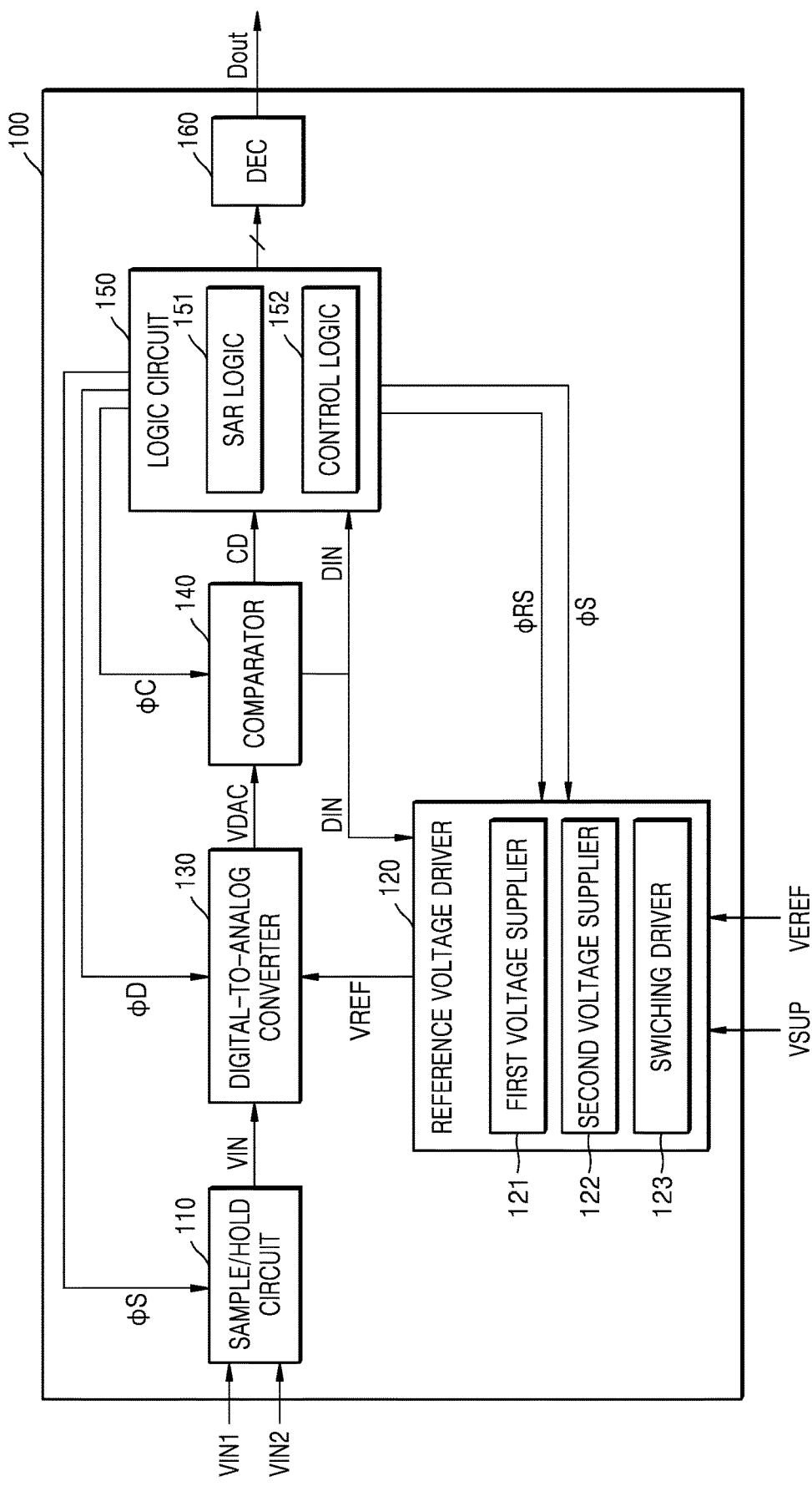
FIG. 1 is a diagram of an analog-to-digital converter according to an embodiment.

Hereinafter, embodiments will be described in detail with reference to the accompanying drawings. These embodiments are provided so that the disclosure may be conveyed to one of ordinary skill in the art. As embodiments allows for various changes and numerous embodiments, example embodiments will be illustrated in the drawings and described in detail in the written description. However, this is not intended to limit embodiments to particular modes of practice, and it is to be appreciated that all changes, equivalents, and substitutes that do depart from the spirit and technical scope of the disclosure are encompassed in embodiments. In the drawings, like reference characters refer to like elements throughout. In the drawings, the size of elements may be exaggerated or reduced for clarity.

As is traditional in the field, embodiments may be described and illustrated in terms of blocks which carry out a described function or functions. These blocks, which may be referred to herein as units or modules or the like, or by names such as driver, controller, device, converter, supplier, array, oscillator, interface, or the like, may be physically implemented by analog or digital circuits such as logic gates, integrated circuits, microprocessors, microcontrollers, memory circuits, passive electronic components, active electronic components, optical components, hardwired circuits, or the like, and may be driven by firmware and software. The circuits may, for example, be embodied in one or more semiconductor chips, or on substrate supports such as printed circuit boards and the like. Circuits included in a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks. Likewise, the blocks of the embodiments may be physically combined into more complex blocks.

FIG. 1 is a diagram of an analog-to-digital converter 100 according to an embodiment.

Referring to FIG. 1, the analog-to-digital converter 100 may convert an analog signal into a digital signal Dout. In an embodiment, the analog-to-digital converter 100 may include a successive-approximation-register (SAR) analog-to-digital converter.

An analog signal may represent particular information. Herein, an "analog signal" may be referred to as an "input voltage". An analog signal may correspond to a differential signal. For example, an analog signal may correspond to a difference between a first input voltage VIN1 and a second input voltage VIN2. The first input voltage VIN1 and the second input voltage VIN2 may be received through differential channels of the analog-to-digital converter 100. In an embodiment, the first input voltage VIN1 may be higher than the second input voltage VIN2. For example, the first input voltage VIN1 may be a positive voltage that is greater than 0, and the second input voltage VIN2 may be a negative voltage that is less than 0. However, embodiments are not limited thereto.

The digital signal Dout may have an N-bit value. Herein, a "digital signal" may be referred to as "digital code".

The analog-to-digital converter 100 may receive a supply voltage VSUP and an external reference voltage VEREF from the outside to convert the first and second input voltages VIN1 and VIN2 into the digital signal Dout. In an embodiment, the supply voltage VSUP may be supplied to the analog-to-digital converter 100. The external reference voltage VEREF may be supplied by a regulator or the like outside the analog-to-digital converter 100. The supply voltage VSUP may reliably act as a reference voltage because there is no great external switching activity influencing the supply change of an SAR logic 151. However, the supply voltage VSUP may not be satisfactorily clean because of cross-coupling.

The analog-to-digital converter 100 may determine bit values of the digital signal Dout sequentially from the most significant bit (MSB) to the least significant bit (LSB) and determine the digital signal Dout that is approximate to the first input voltage VIN1 and the second input voltage VIN2. The analog-to-digital converter 100 may convert the first input voltage VIN1 and the second input voltage VIN2 into the digital signal Dout through a plurality of cycles. The analog-to-digital converter 100 may determine an output logic value corresponding to one bit of the digital signal Dout at each cycle. Herein, a "cycle" may refer to a "successive approximation cycle".

The analog-to-digital converter 100 may include a sample/hold circuit 110, a reference voltage driver 120, a digital-to-analog converter (DAC) 130, a comparator 140, and a logic circuit 150.

The sample/hold circuit 110 may perform sampling on the first and second input voltages VIN1 and VIN2 in response to a sample/hold control signal φS. The sample/hold circuit 110 may output a sampled voltage VIN to the DAC 130. In an embodiment, the sampled voltage VIN may include the first and second input voltages VIN1 and VIN2.

The reference voltage driver 120 may output a reference voltage VREF to the DAC 130 based on the supply voltage VSUP and the external reference voltage VEREF in response to the sample/hold control signal ϕS and a switching control signal ϕRS. In detail, the reference voltage driver 120 may perform sampling on the external reference voltage VEREF in a sampling phase in response the sample/hold control signal ϕS and output a voltage, which is selected between a reference voltage sampled in the sampling phase and the supply voltage VSUP according to the logic level of the switching control signal ϕRS, to the DAC 130 as the reference voltage VREF.

In an embodiment, the reference voltage driver 120 may include a first voltage supplier 121, a second voltage supplier 122, and a switching driver 123. In embodiments, the first voltage supplier and the second voltage supplier may be referred to as voltage supplier circuits.

The first voltage supplier 121 may receive and output the supply voltage VSUP.

The second voltage supplier 122 may perform sampling on the external reference voltage VEREF in response to the sample/hold control signal ϕS in a sampling phase and output a sampled reference voltage.

After the sampling phase, the switching driver 123 may electrically connect the first voltage supplier 121 to the DAC 130 during a first conversion phase under the control of the logic circuit 150 and electrically connect the second voltage supplier 122 to the DAC 130 during a second conversion phase under the control of the logic circuit 150. In detail, during the first conversion phase, the switching driver 123 may electrically connect the first voltage supplier 121 to the DAC 130 in response to a first logic level of the switching control signal ϕRS. During the second conversion phase, the switching driver 123 may electrically connect the second voltage supplier 122 to the DAC 130 in response to a second logic level of the switching control signal ϕRS. A conversion phase may refer to a phase, in which a conversion operation is performed to generate a bit value of the digital signal Dout. The electrical connection between one of the first voltage supplier 121 and second voltage supplier 122 and the DAC 130 may refer to the transmission of the supply voltage VSUP or a sample reference voltage to the DAC 130. For example, the first logic level may be a logic low level, and the second logic level may be a logic high level, but embodiments are not limited thereto.

The DAC 130 may generate comparison voltages VDAC, which are used to generate a plurality of bits of the digital signal Dout, based on the sampled voltage VIN and the reference voltage VREF in response to a conversion control signal ϕD. The comparison voltages VDAC may have a voltage level obtained by adding or subtracting the voltage level of the reference voltage VREF to or from the voltage level of the sampled voltage VIN. In an embodiment, the comparison voltages VDAC may be classified into a first comparison voltage and a second comparison voltage.

The comparator 140 may compare the comparison voltages VDAC with each other in response to a comparison control signal ϕC and output a comparison result voltage DIN representing a comparison result. The comparison control signal ϕC may include a square wave (e.g., a clock signal, or a pulse wave) having a certain period after a particular time, for example a sampling phase. The comparison result voltage DIN may represent a comparison logic value.

The comparator 140 may also output a comparison completion signal CD together with the comparison result voltage DIN. In detail, the comparator 140 may output the comparison completion signal CD having a certain logic level to the logic circuit 150 each time that the comparator 140 completes a comparison operation, which may be for example an operation in which the comparison voltages VDAC are compared with each other.

The logic circuit 150 may generally control the operation of the analog-to-digital converter 100. In an embodiment, the logic circuit 150 may generate the sample/hold control signal ϕS, the switching control signal ϕRS, the conversion control signal ϕD, and the comparison control signal ϕC. The logic circuit 150 may control the DAC 130 according to the logic level of the comparison result voltage DIN representing a comparison logic value. The logic circuit 150 may terminate an analog-to-digital conversion process based on whether the logic level of the comparison result voltage DIN satisfies a certain condition, and determine N bits of the digital signal Dout, where N is a natural number of at least 1. The logic circuit 150 may include a successive approximation register storing the N bits of the digital signal Dout. The logic circuit 150 may arrange digital values in a sequence, thereby generating the digital signal Dout.

In an embodiment, the logic circuit 150 may include the SAR logic 151 and a control logic 152. Detailed descriptions of examples thereof will be given with reference to FIG. 2 below.

Each of the sample/hold control signal ϕS, the switching control signal ϕRS, the conversion control signal ϕD, and the comparison control signal ϕC may have the first logic level or the second logic level. In an embodiment, the second logic level may be higher than the first logic level. For example, the second logic level may correspond to a logic high level, and the first logic level may correspond to a logic low level. However, embodiments are not limited thereto. The second logic level may correspond to the logic low level, and the first logic level may correspond to the logic high level.

A digital error correction (DEC) circuit 160 may detect an error in the digital signal Dout, correct the error in the digital signal Dout, and output the digital signal Dout that has undergone error correction.

Figure 2:
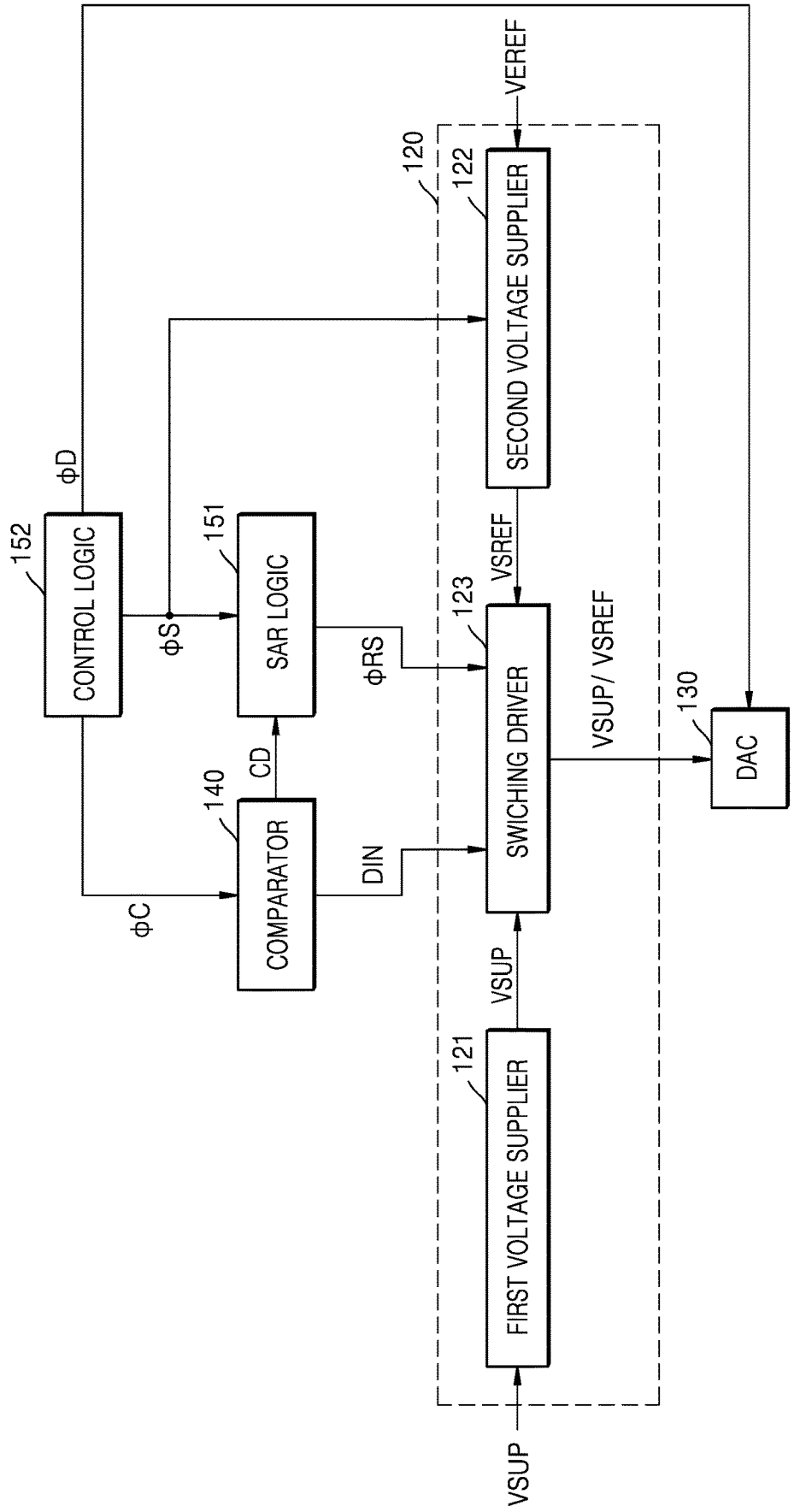
FIG. 2 is a diagram illustrating a reference voltage driver according to an embodiment.

FIG. 2 is a diagram illustrating portions of the analog-to-digital converter 100, including the reference voltage driver 120 according to an embodiment.

Referring to FIG. 2, the reference voltage driver 120 may include the first voltage supplier 121, the second voltage supplier 122, and the switching driver 123.

The first voltage supplier 121 may transmit the supply voltage VSUP, which is externally received, to the switching driver 123. In an embodiment, the first voltage supplier 121 may include a low-dropout regulator. The low-dropout regulator may regulate the supply voltage VSUP.

The second voltage supplier 122 may perform sampling on the external reference voltage VEREF in response to the sample/hold control signal ϕS and output a sampled reference voltage VSREF to the switching driver 123. The external reference voltage VEREF may be supplied by a regulator outside the reference voltage driver 120.

The switching driver 123 may receive the supply voltage VSUP and the sampled reference voltage VSREF. The switching driver 123 may transmit either the supply voltage VSUP or the sampled reference voltage VSREF to the DAC 130 based on the comparison result voltage DIN and the switching control signal ϕRS.

The comparator 140 may output the comparison result voltage DIN and the comparison completion signal CD in response to the comparison control signal ϕC.

The SAR logic 151 may output the switching control signal ϕRS to the switching driver 123 based on the sample/hold control signal ϕS and the comparison completion signal CD.

The control logic 152 may output the comparison control signal ϕC to the comparator 140, output the sample/hold control signal ϕS to the SAR logic 151 and the second voltage supplier 122, and output the conversion control signal ϕD to the DAC 130.

As described above, when a voltage supplied as a reference voltage is switched according to a conversion phase, the reference voltage may be reliably supplied without static power consumption.

Figure 3A:
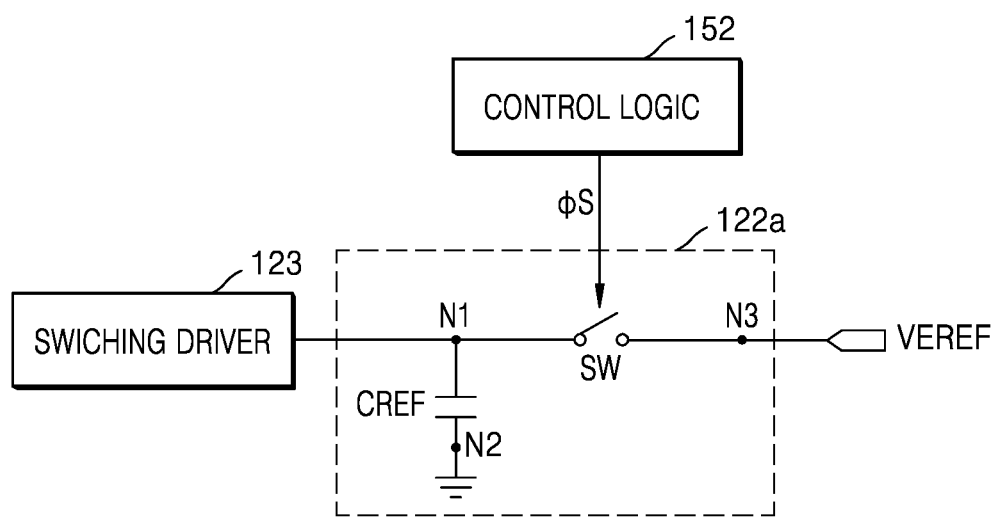
FIGS. 3A and 3B are diagrams illustrating second voltage suppliers according to embodiments.
Figure 3B:
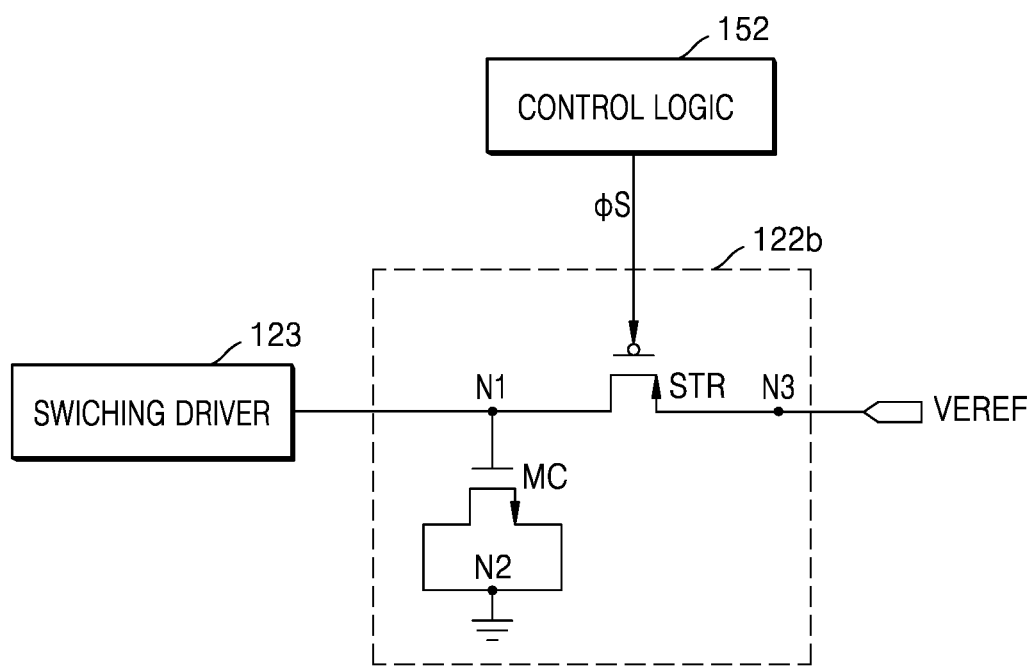

FIGS. 3A and 3B are diagrams illustrating second voltage suppliers according to embodiments.

Referring to FIG. 3A, a second voltage supplier 122a may include a reference capacitor CREF and a switch SW.

The reference capacitor CREF may be connected between a first node N1, to which the switching driver 123 is connected, and a second node N2, to which a ground voltage is applied. In detail, the first terminal of the reference capacitor CREF may be connected to the first node N1, and the second terminal of the reference capacitor CREF may be connected to the second node N2. The reference capacitor CREF may charge the external reference voltage VEREF to the sampled reference voltage VSREF. In detail, the reference capacitor CREF may accumulate charges in an amount corresponding to the difference between the external reference voltage VEREF and the ground voltage. A voltage corresponding to the accumulated charges may be the sampled reference voltage VSREF. The reference capacitor CREF may have a certain capacitance.

The switch SW may be connected between the first node N1 and a third node N3, to which the external reference voltage VEREF is applied. The switch SW may be turned on during a sampling phase in response to the sample/hold control signal ϕS. When the switch SW is turned on, the switch SW may electrically connect the first node N1 to the third node N3. When the first node N1 is electrically connected to the third node N3, the external reference voltage VEREF may be applied to the first node N1.

In an embodiment, the voltage level of the external reference voltage VEREF may be equal to the voltage level of the sampled reference voltage VSREF.

Referring to FIG. 3B, a second voltage supplier 122b may include a reference metal-oxide-semiconductor (MOS) capacitor MC and a switching transistor STR.

The reference MOS capacitor MC may be connected between a first node N1, to which the switching driver 123 is connected, and a second node N2, to which the ground voltage is applied. In detail, a gate electrode of the reference MOS capacitor MC may be connected to the first node N1, and a first electrode (e.g., a source electrode) and a second electrode (e.g., a drain electrode) of the reference MOS capacitor MC may be connected to the second node N2. The reference MOS capacitor MC may include an N-channel MOS (NMOS) but is not limited thereto. The reference MOS capacitor MC may include a P-channel MOS (PMOS).

In an embodiment, the capacitance of the reference MOS capacitor MC in FIG. 3B may be equal to the capacitance of the reference capacitor CREF in FIG. 3A.

The switching transistor STR may be connected between the first node N1 and a third node N3, to which the external reference voltage VEREF is applied. In detail, the sample/hold control signal ϕS may be applied to a gate electrode of the switching transistor STR, a first electrode (e.g., a source electrode) of the switching transistor STR may be connected to the third node N3, and a second electrode (e.g., a drain electrode) of the switching transistor STR may be connected to the first node N1. The switching transistor STR may include a PMOS but is not limited thereto. The switching transistor STR may be turned on during a sampling phase in response to a turn-on level of the sample/hold control signal ϕS. When the switching transistor STR is turned on, the switching transistor STR may transmit the external reference voltage VEREF to the first node N1.

The second voltage supplier 122a or 122b is not limited to the illustration in FIG. 3A or 3B. In embodiments, a second voltage supplier may include any combination of the reference MOS capacitor MC, the switch SW or the reference capacitor CREF, and the switching transistor STR in any configuration as desired.

Figure 4:
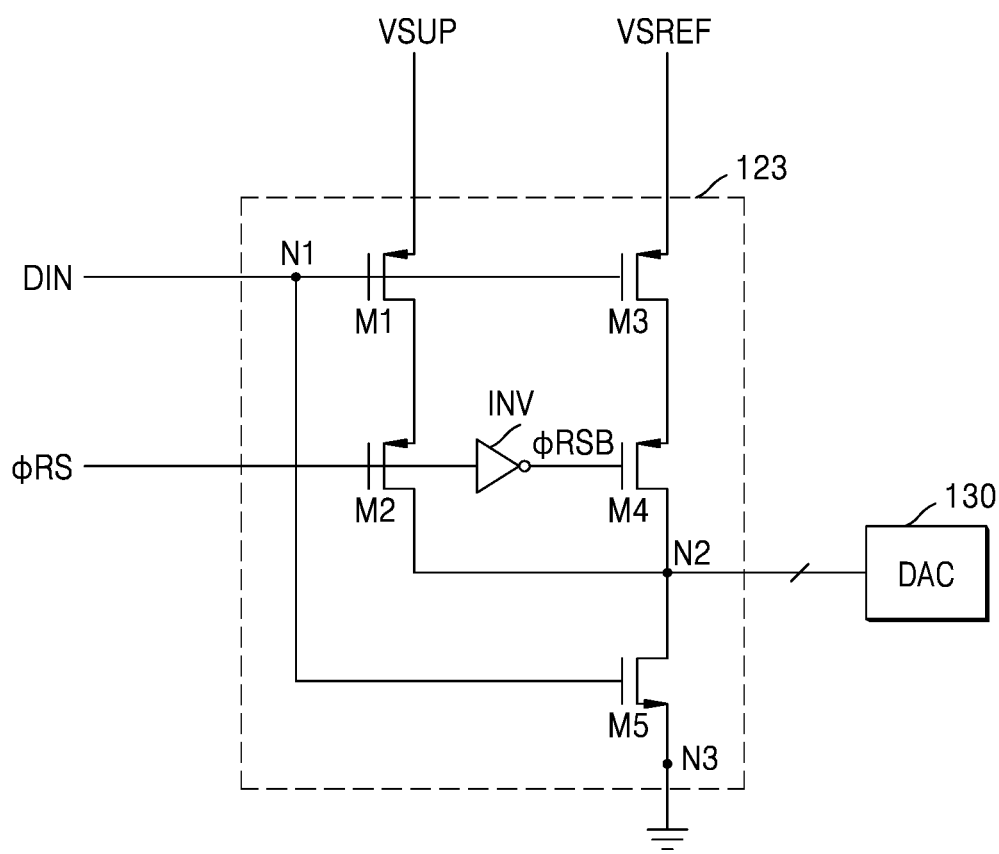
FIG. 4 is a diagram illustrating a switching driver according to an embodiment.

FIG. 4 is a diagram illustrating the switching driver 123 according to an embodiment.

Referring to FIG. 4, the switching driver 123 may include a first transistor M1, a second transistor M2, a third transistor M3, a fourth transistor M4, a fifth transistor M5, and an inverter INV.

The first transistor M1 may be connected between the first voltage supplier 121 and a second node N2. In detail, a gate electrode of the first transistor M1 may be connected to a first node N1, a first electrode (e.g., a source electrode) of the first transistor M1 may be connected to the first voltage supplier 121, and a second electrode (e.g., a drain electrode) of the first transistor M1 may be connected to a first electrode (e.g., a source electrode) of the second transistor M2. The first transistor M1 may transmit the supply voltage VSUP in response to the comparison result voltage DIN. The comparison result voltage DIN may be applied to the first node N1. The DAC 130 may be connected to the second node N2.

The second transistor M2 may be connected between the first voltage supplier 121 and the second node N2. The second transistor M2 may be connected in series to the first transistor M1. In detail, the switching control signal ϕRS may be applied to a gate electrode of the second transistor M2, the first electrode of the second transistor M2 may be connected to the second electrode of the first transistor M1, and a second electrode (e.g., a drain electrode) of the second transistor M2 may be connected to the second node N2. The second transistor M2 may be turned on in response to a turn-on level of the switching control signal ϕRS. When the second transistor M2 is turned on, the second transistor M2 may electrically connect the first transistor M1 to the second node N2.

The third transistor M3 may be connected between the second voltage supplier 122 and the second node N2. In detail, a gate electrode of the third transistor M3 may be connected to the first node N2, a first electrode (e.g., a source electrode) of the third transistor M3 may be connected to the second voltage supplier 122, and a second electrode (e.g., a drain electrode) of the third transistor M3 may be connected to a first electrode (e.g., a source electrode) of the fourth transistor M4. The third transistor M3 may transmit the sampled reference voltage VSREF in response to the comparison result voltage DIN. In an embodiment, the first electrode of the third transistor M3 may be connected to the first terminal of the reference capacitor CREF in FIG. 3A. In an embodiment, the first electrode of the third transistor M3 may be connected to the gate electrode of the reference MOS capacitor MC in FIG. 3B.

The fourth transistor M4 may be connected between the second voltage supplier 122 and the second node N2. The fourth transistor M4 may be connected in series to the third transistor M3. In detail, an inverted switching control signal φRSB may be applied to a gate electrode of the fourth transistor M4, the first electrode of the fourth transistor M4 may be connected to the second electrode of the third transistor M3, and a second electrode (e.g., a drain electrode) of the fourth transistor M4 may be connected to the second node N2. The fourth transistor M4 may be turned on in response to a turn-on level of the inverted switching control signal φRSB. When the fourth transistor M4 is turned on, the fourth transistor M4 may electrically connect the third transistor M3 to the second node N2.

The fifth transistor M5 may be connected between the second node N2 and a third node N3 In detail, a gate electrode of the fifth transistor M5 may be connected to the first node N1, a first electrode of the fifth transistor M5 may be connected to the second node N2, and a second electrode of the fifth transistor M5 may be connected to the third node N3. The ground voltage may be applied to the third node N3. The fifth transistor M5 may electrically connect the second node N2 to the third node N3 in response to a turn-on level of the comparison result voltage DIN.

The inverter INV may receive the switching control signal φRS and output the inverted switching control signal φRSB. The inverted switching control signal φRSB may be obtained by inverting the switching control signal φRS.

There may be a plurality of wires connecting the second node N2 to the DAC 130. The DAC 130 may be selectively supplied with the supply voltage VSUP or the sampled reference voltage VSREF as the reference voltage VREF through the second node N2. The DAC 130 may also be supplied with the ground voltage through the second node N2.

Figure 5:
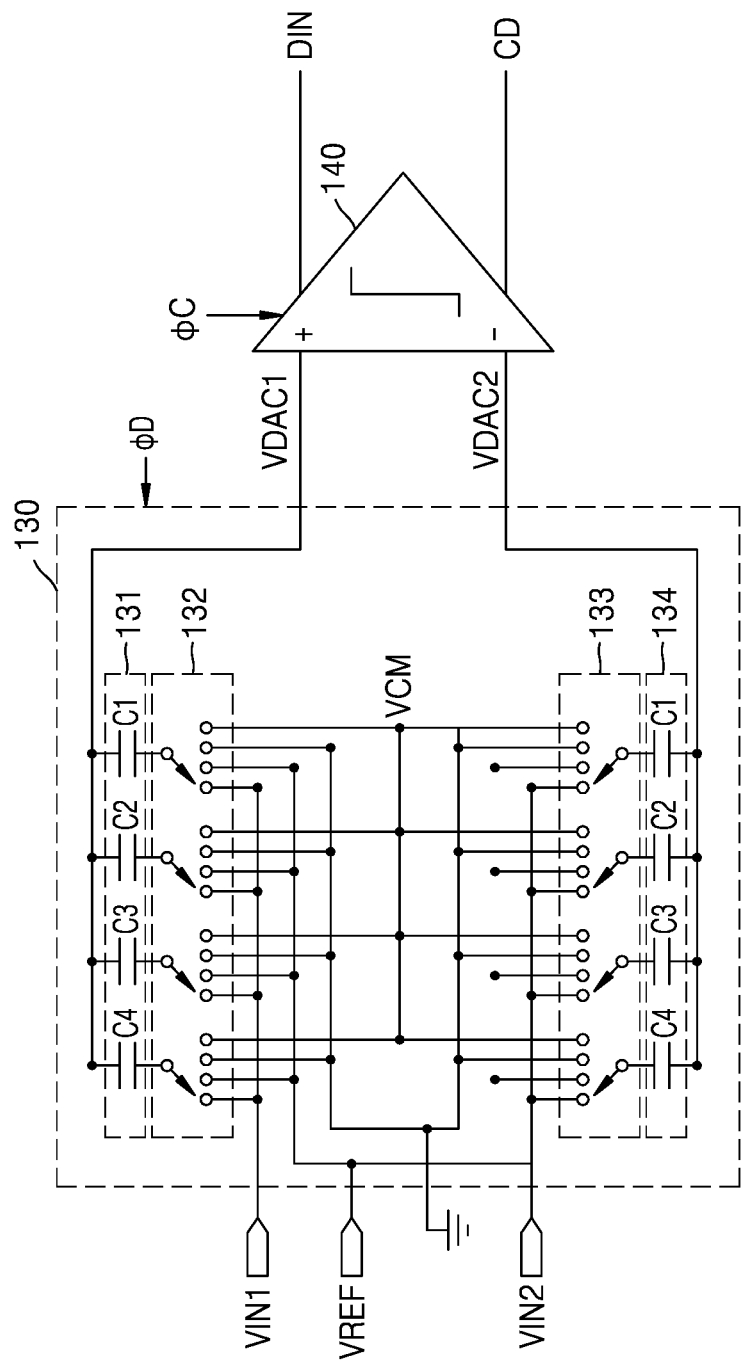
FIG. 5 is a diagram illustrating a digital-to-analog converter (DAC) and a comparator, according to an embodiment.

FIG. 5 is a diagram illustrating the DAC 130 and the comparator 140, according to an embodiment.

Referring to FIG. 5, the DAC 130 may include a first capacitor array 131, a first switch circuit 132, a second switch circuit 133, and a second capacitor array 134.

The first capacitor array 131 may include a plurality of capacitors. For example, the first capacitor array 131 may include first to fourth capacitors C1, C2, C3, and C4. However, embodiments are not limited thereto. The number of capacitors included in the first capacitor array 131 may be determined according to the resolution of the analog-to-digital converter 100 or the number of bits in the digital signal Dout. For example, when the analog-to-digital converter 100 has a resolution of 3 bits, the first capacitor array 131 may include three capacitors, e.g., the first to third capacitors C1, C2, and C3. The first capacitor array 131 may further include at least one correction capacitor. For example, the fourth capacitor C4 of the first capacitor array 131 may correspond to a correction capacitor. Hereinafter, for convenience of description, it is assumed that the first capacitor array 131 includes the first to fourth capacitors C1, C2, C3, and C4. The "first capacitor array" described herein may be referred to as an "upper capacitor array".

A first terminal of each of the first to fourth capacitors C1, C2, C3, and C4 may be connected to a first input terminal (or a non-inverting terminal) of the comparator 140. A second terminal of each of the first to fourth capacitors C1, C2, C3, and C4 may be selectively connected to the first input voltage VIN1, the reference voltage VREF, the ground voltage, or a common voltage VCM through the first switch circuit 132. The first to third capacitors C1, C2, and C3 may respectively correspond to bits from an MSB to an LSB. For example, the first capacitor C1 may correspond to the MSB, the second capacitor C2 may correspond to a bit following the MSB, and the third capacitor C3 may correspond to the LSB. The first to third capacitors C1, C2, and C3 may have different capacitances from one another to differently distribute charges. In detail, the first to third capacitors C1, C2, and C3 may have different binary-weighted capacitances. In other words, the capacitance of a capacitor corresponding to a certain bit in the digital signal Dout may be double the capacitance of a capacitor corresponding to a lower bit next to the certain bit. For example, the capacitance of the first capacitor C1 may be double the capacitance of the second capacitor C2, and the capacitance of the second capacitor C2 may be double the capacitance of the third capacitor C3. The capacitance of the fourth capacitor C4 may be equal to the capacitance of the third capacitor C3 corresponding to the LSB.

The first switch circuit 132 may be connected to the first capacitor array 131. The first switch circuit 132 may transmit the first input voltage VIN1, the reference voltage VREF, the ground voltage, or the common voltage VCM to each of a plurality of capacitors included in the first capacitor array 131 in response to the conversion control signal φD.

The second switch circuit 133 may be connected to the second capacitor array 134. The second switch circuit 133 may transmit the second input voltage VIN2, the reference voltage VREF, the ground voltage, or the common voltage VCM to each of a plurality of capacitors included in the second capacitor array 134.

The second capacitor array 134 may include the same number of capacitors as the first capacitor array 131. For example, the second capacitor array 134 may include first to third capacitors C1, C2, and C3, which respectively correspond to the bits of the digital signal Dout, and a fourth capacitor C4 corresponding to a correction capacitor. The "second capacitor array" described herein may be referred to as a "lower capacitor array". A first terminal of each of the first to fourth capacitors C1, C2, C3, and C4 of the second capacitor array 134 may be connected to a second input terminal (or an inverting terminal) of the comparator 140. A second terminal of each of the first to fourth capacitors C1, C2, C3, and C4 of the second capacitor array 134 may be selectively connected to the second input voltage VIN2, the reference voltage VREF, the ground voltage, or the common voltage VCM through the second switch circuit 133. The first to third capacitors C1, C2, and C3 may have different binary-weighted capacitances, and the capacitance of the fourth capacitor C4 may be equal to the capacitance of the third capacitor C3.

In an embodiment, the fourth capacitor C4 of the first capacitor array 131 or second capacitor array 134 may have a first capacitance, and the reference capacitor CREF of the second voltage supplier 122a may have a second capacitance. In this case, the second capacitance of the reference capacitor CREF may be greater than the first capacitance of the fourth capacitor C4.

In an embodiment, the fourth capacitor C4 of the first capacitor array 131 or second capacitor array 134 may have a first capacitance, and the reference MOS capacitor MC of the second voltage supplier 122b may have a second capacitance. In this case, the second capacitance of the reference MOS capacitor MC may be greater than the first capacitance of the fourth capacitor C4.

The comparator 140 may receive a first comparison voltage VDAC1 through a first input terminal and a second comparison voltage VDAC2 through a second input terminal. The comparator 140 may output the comparison result voltage DIN having a first logic level or a second logic level according to a differential voltage between the first comparison voltage VDAC1 and the second comparison voltage VDAC2. The first logic level may correspond to, for example, a logic low level or 0, and the second logic level may correspond to, for example, a logic high level or 1, or vice versa. When the first comparison voltage VDAC1 is higher than the second comparison voltage VDAC2, the comparator 140 may output the second logic level, the logic high level, or 1 as the comparison result voltage DIN. When the first comparison voltage VDAC1 is lower than the second comparison voltage VDAC2, the comparator 140 may output the first logic level, the logic low level, or 0 as the comparison result voltage DIN.

The comparator 140 may output the comparison completion signal CD, which indicates the completion of a comparison operation, each time that the comparison between the first comparison voltage VDAC1 and the second comparison voltage VDAC2 is completed.

Figure 6:
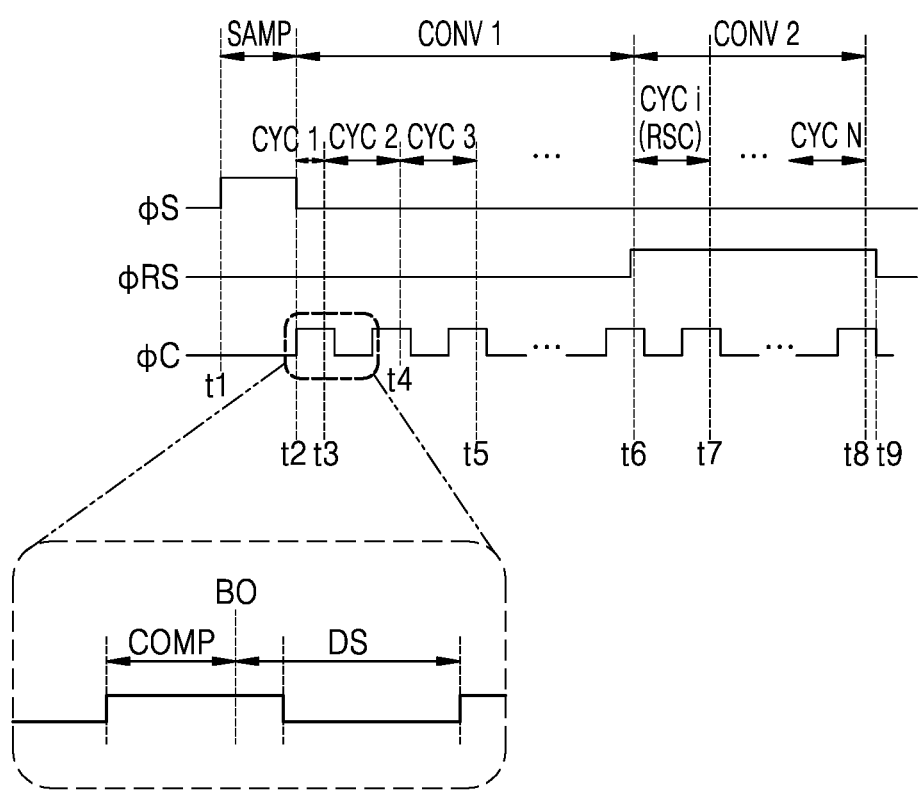
FIG. 6 is a timing chart of a sample/hold control signal, a switching control signal, and a comparison control signal, according to an embodiment.

FIG. 6 is a timing chart of the sample/hold control signal ϕS, the switching control signal ϕRS, and the comparison control signal ϕC, according to an embodiment.

Referring to FIG. 6, the operation of the analog-to-digital converter 100 may be divided into a sampling phase SAMP and a conversion phase. The conversion phase may include a first conversion phase CONV1 and a second conversion phase CONV2.

In the sampling phase SAMP, a sampling operation may be performed on the external reference voltage VEREF, the first input voltage VIN1, and the second input voltage VIN2. The sampling phase SAMP may be from a first time point t1 to a second time point t2. During the sampling phase SAMP, the sample/hold control signal ϕS may have the second logic level, and each of the switching control signal ϕRS and the comparison control signal ϕC may have the first logic level. In this case, the second logic level of the sample/hold control signal ϕS may correspond to a turn-on level.

During the conversion phase after the sampling phase SAMP, the sample/hold control signal ϕS may have a turn-off level. For example, the sample/hold control signal ϕS may have the first logic level.

During the first conversion phase CONV1 and the second conversion phase CONV2, the comparison control signal ϕC may toggle with a certain period. In other words, during the first conversion phase CONV1 and the second conversion phase CONV2, the comparison control signal ϕC may correspond to a clock signal, which has first logic levels alternating with second logic levels. A single period of the comparison control signal ϕC may include a comparison phase COMP, a bit out point BO, and a settling phase DS. In the comparison phase COMP, the comparator 140 may operate. The bit out point BO may be a time at which the comparison result voltage DIN is output. In the settling phase DS, resetting may be performed after the comparison result voltage DIN is output. During the first conversion phase CONV1 and the second conversion phase CONV2, the comparison control signal ϕC may have N cycles. N may be an integer of at least 2. The number of cycles may be determined according to the resolution of the analog-to-digital converter 100 or the number of bits of the digital signal Dout. In a first cycle CYC 1, a digital signal corresponding to an MSB may be generated. In a second cycle CYC 2, a digital signal corresponding to an (MSB−1)-th bit may be generated. In a third cycle CYC 3, a digital signal corresponding to an (MSB−2)-th bit may be generated. In an i-th cycle CYC i, a correction operation (or a calibration or redundancy operation) may be performed based on a correction capacitor. In an N-th cycle CYC N, a digital signal corresponding to an LSB may be generated. The i-th cycle CYC i may correspond to a switching cycle RSC, in which the reference voltage VREF is switched from the supply voltage VSUP to the sampled reference voltage VSREF. Each cycle may correspond to a period of the comparison control signal ϕC. Each cycle may correspond to a period from a certain bit out point BO of the comparison control signal ϕC to a subsequent bit out point BO thereof. For example, the second cycle CYC 2 may correspond to a period from a third time point t3 to a fourth time point t4, and the third cycle CYC 3 may correspond to a period from the fourth time point t4 to a fifth time point t5. However, embodiments are not limited thereto.

In the first conversion phase CONV1, a digital signal having an upper bit or the MSB may be generated. The first conversion phase CONV1 may be after the sampling phase SAMP. The sampling phase SAMP may be from the second time point t2 to a sixth time point t6. The first conversion phase CONV1 may include cycles, in which digital signals respectively having the MSB, the (MSB−1)-th bit, the (MSB−2)-th bit, and so on are generated, and a cycle, in which a digital signal having an (LSB−1)-th bit is generated. Referring to FIG. 6, the first conversion phase CONV1 may include the first to (i−1)-th cycles CYC 1 to CYC (i−1). During the first conversion phase CONV1, the switching control signal ϕRS may have the first logic level. When the switching control signal ϕRS has the first logic level, the supply voltage VSUP may be transmitted to the DAC 130 as the reference voltage VREF.

The second conversion phase CONV2 may be after the first conversion phase CONV1. In an embodiment, the second conversion phase CONV2 may be shorter than or equal to the first conversion phase CONV1. The number of cycles included in the second conversion phase CONV2 may be less than or equal to the number of cycles included in the first conversion phase CONV1. In other words, the number of cycles during the first conversion phase CONV1 may be greater than or equal to the number of cycles during the second conversion phase CONV2. The switching control signal ϕRS may have the second logic level at the sixth time point t6, at which the transition from the first conversion phase CONV1 to the second conversion phase CONV2 occurs. When the switching control signal ϕRS has the second logic level, the sampled reference voltage VSREF may be transmitted to the DAC 130 as the reference voltage VREF.

At a ninth time point t9, the switching control signal ϕRS may have the first logic level.

Figure 7:
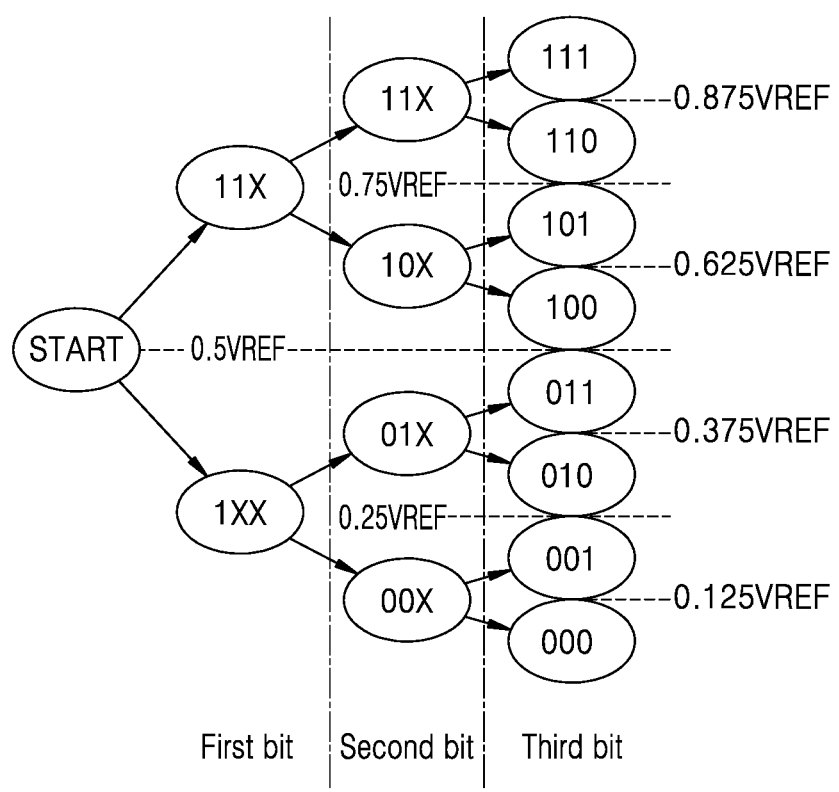
FIG. 7 is a diagram illustrating a digital signal according to an embodiment.

FIG. 7 is a diagram illustrating a digital signal according to an embodiment.

Referring to FIG. 7, while performing a conversion operation on a sampled signal, the DAC 130 may update a comparison voltage VDAC through a switching operation for each of bits from an MSB to an LSB and determine data of a digital signal according to a comparison result.

In an embodiment, a difference between a comparison voltage VDAC of a bit to be converted and a comparison voltage VDAC of an upper bit closest to the bit to be converted may decrease as the bit to be converted is a lower bit. As the DAC 130 sequentially performs conversion operations respectively on bits from the MSB to the LSB, the difference between the comparison voltage VDAC of the bit to be converted and the comparison voltage VDAC of the upper bit closest to the bit to be converted may decrease. In an embodiment, when an input signal is received in a single-ended mode and analog-to-digital conversion is performed, a difference between a comparison voltage VDAC for a conversion operation on the second bit and a comparison voltage VDAC for a conversion operation on the MSB (i.e., the first bit) may be 0.25Vref, and a difference between a comparison voltage VDAC for a conversion operation on the third bit and a comparison voltage VDAC for a conversion operation on the second bit may be 0.125Vref. In other words, when a conversion operation is performed on a lower bit, a sophisticated voltage shift may be necessary for accurate comparison.

Figure 8:
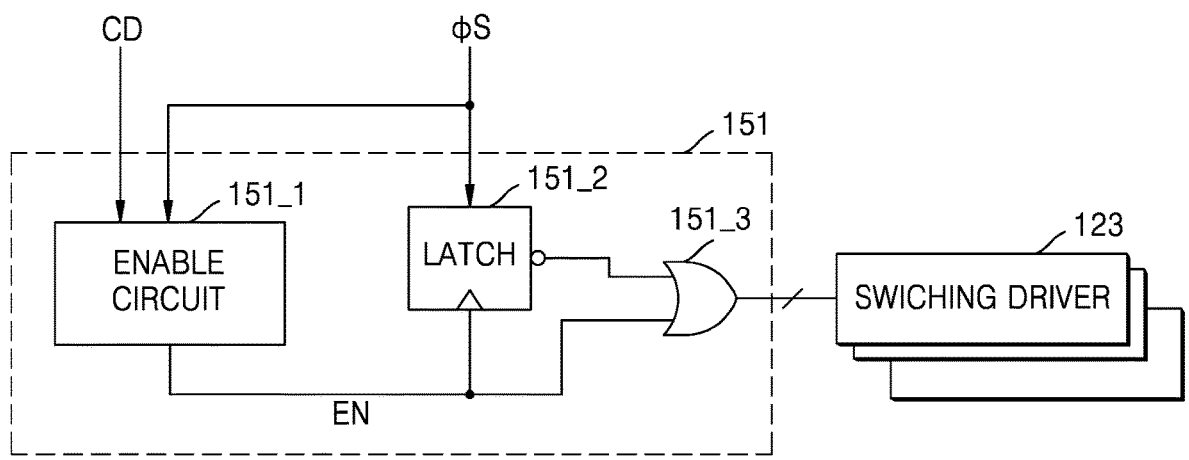
FIG. 8 is a diagram illustrating a successive-approximation-register (SAR) logic according to an embodiment.

FIG. 8 is a diagram illustrating the SAR logic 151 according to an embodiment.

Referring to FIG. 8, the SAR logic 151 may include an enable circuit 151_1, a latch 151_2, and a logic gate 151_3.

The enable circuit 151_1 may output an enable signal EN based on the sample/hold control signal ϕS and the comparison completion signal CD.

The latch 151_2 may latch the enable signal EN based on the sample/hold control signal ϕS and the enable signal EN and output an inverted signal of a latched signal.

The logic gate 151_3 may perform an OR operation on the enable signal EN and the inverted signal output from the latch 151_2 and output a result of the OR operation as the switching control signal ϕRS. In an embodiment, the logic gate 151_3 may include an OR gate.

There may be a plurality of switching drivers 123. The number of switching drivers 123 may be the sum of the number of bits in the digital signal Dout and the number of bits for a correction (or redundancy) operation.

Figure 9:
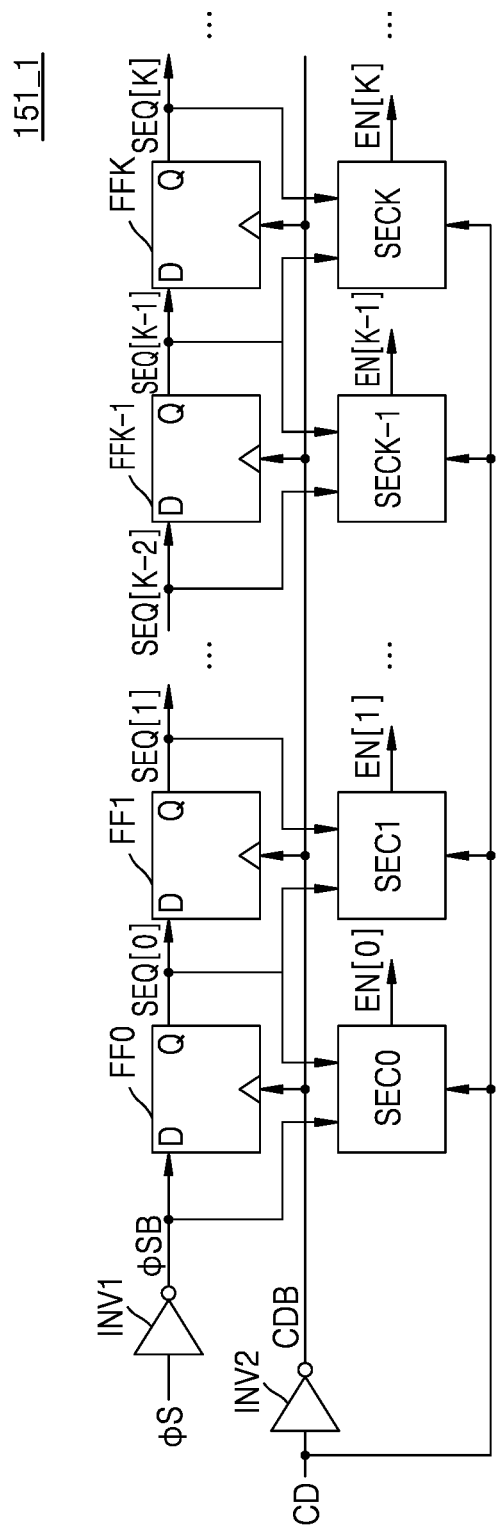
FIG. 9 is a diagram of an enable circuit according to an embodiment.

FIG. 9 is a diagram of the enable circuit 151_1 according to an embodiment.

Referring to FIG. 9, the enable circuit 151_1 may include a first inverter INV1, a second inverter INV2, first to (K+1)-th flip-flops FF0 to FFK, and first to (K+1)-th logic operation circuits SEC0 to SECK. In embodiments, K may be a natural number.

The first inverter INV1 may receive the sample/hold control signal ϕS and output an inverted sample/hold control signal ϕSB. The inverted sample/hold control signal ϕSB may be obtained by inverting the sample/hold control signal ϕS.

The second inverter INV2 may output an inverted comparison completion signal CDB by inverting the comparison completion signal CD.

Each of the first to (K+1)-th flip-flops FF0 to FFK may receive the inverted comparison completion signal CDB as a clock input. The first to (K+1)-th flip-flops FF0 to FFK may be sequentially connected in series to each other. For example, the first flip-flop FF0 may receive the inverted sample/hold control signal ϕSB as a data input, and output a first output signal SEQ[1] in response to the inverted comparison completion signal CDB. The second flip-flop FF1 may receive the first output signal SEQ[0] as a data input, and output a second output signal SEQ[1] in response to the inverted comparison completion signal CDB. The (K+1)-th flip-flop FFK may receive, as a data input, a K-th output signal SEQ[K−1] output from the K-th flip-flop FFK−1 and output a (K+1)-th output signal SEQ[K] in response to the inverted comparison completion signal CDB.

Each of the first to (K+1)-th logic operation circuits SEC0 to SECK may receive the comparison completion signal CD as a clock input. Each of the first to (K+1)-th logic operation circuits SEC0 to SECK may output an enable signal based on two consecutive output signals in response to the comparison completion signal CD. For example, the first logic operation circuit SEC0 may receive the first output signal SEQ[0] and the inverted sample/hold control signal ϕSB and output a first enable signal EN[0] in response to the comparison completion signal CD. The second logic operation circuit SEC1 may receive the second output signal SEQ[1] and the first output signal SEQ[0] and output a second enable signal EN[1] in response to the comparison completion signal CD. The (K+1)-th logic operation circuit SECK may output a (K+1)-th enable signal EN[K] based on the (K+1)-th output signal SEQ[K] and the K-th output signal SEQ[K−1] in response to the comparison completion signal CD.

Figure 10:
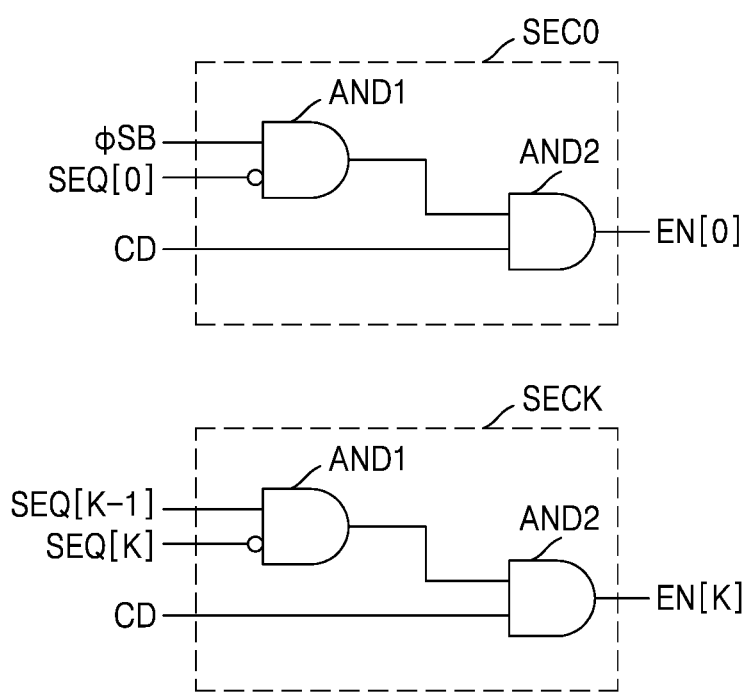
FIG. 10 is a diagram illustrating logic operation circuits according to an embodiment.

FIG. 10 is a diagram illustrating logic operation circuits according to an embodiment.

Referring to FIGS. 9 and 10, each of the first to (K+1)-th logic operation circuits SEC0 to SECK may include a first logic gate AND1 and a second logic gate AND2.

In an embodiment, the first logic gate AND1 of the first logic operation circuit SEC0 may receive a first inverted output signal, which may be a result of an inversion of the first output signal SEQ[0], and the inverted sample/hold control signal ϕSB. The first logic gate AND1 of the first logic operation circuit SEC0 may perform an AND operation on the first inverted output signal and the inverted sample/hold control signal ϕSB. The first logic gate AND1 of the first logic operation circuit SEC0 may output a first operation result signal. The second logic gate AND2 of the first logic operation circuit SEC0 may receive the first operation result signal and the comparison completion signal CD. The second logic gate AND2 of the first logic operation circuit SEC0 may perform an AND operation on the first operation result signal and the comparison completion signal CD. The second logic gate AND2 of the first logic operation circuit SEC0 may output a second operation result signal as the first enable signal EN[0].

In an embodiment, the first logic gate AND1 of the (K+1)-th logic operation circuit SECK may receive a (K+1)-th inverted output signal, which may be a result of an inversion of the (K+1)-th output signal SEQ[K], and the K-th output signal SEQ[K−1]. The first logic gate AND1 of the (K+1)-th logic operation circuit SECK may perform an AND operation on the (K+1)-th inverted output signal and the K-th output signal SEQ[K−1] and output a first operation result signal. The second logic gate AND2 of the (K+1)-th logic operation circuit SECK may receive the first operation result signal and the comparison completion signal CD and output a second operation result signal as the (K+1)-th enable signal EN[K].

Figure 11:
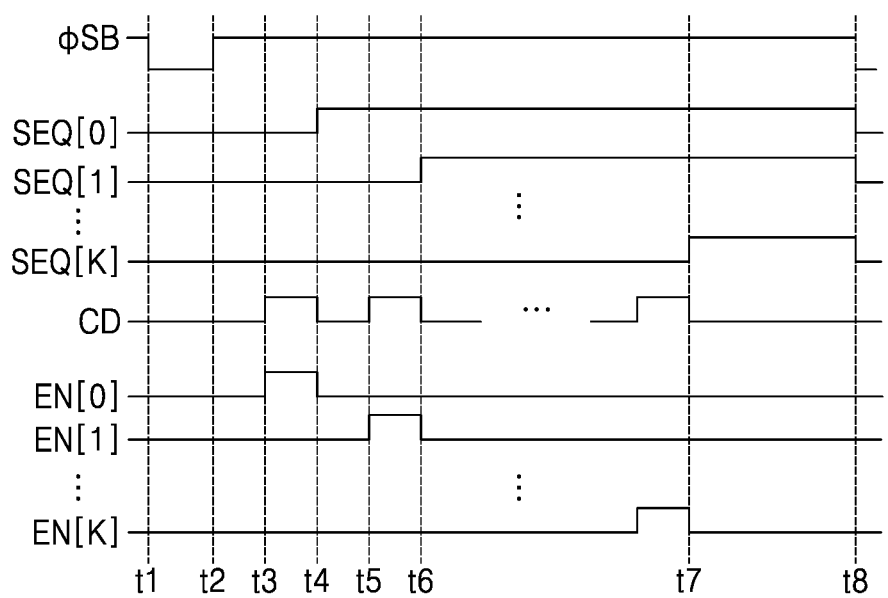
FIG. 11 is a timing chart of an inverted sample/hold control signal, an output signal, a comparison completion signal, and an enable signal, according to an embodiment.

FIG. 11 is a timing chart of the inverted sample/hold control signal ϕSB, an output signal, the comparison completion signal CD, and an enable signal, according to an embodiment Referring to FIG. 11, the inverted sample/hold control signal ϕSB may change from the second logic level (e.g., the logic high level) to the first logic level (e.g., the logic low level) at the first time point t1. The inverted sample/hold control signal ϕSB may be maintained at the first logic level from the first time point t1 to the second time point t2. The inverted sample/hold control signal ϕSB may have the second logic level after the second time point t2. A period from the first time point t1 to the second time point t2 may correspond to a sampling phase.

The first to (K+1)-th output signals SEQ[0] to SEQ[K] may sequentially change from the first logic level to the second logic level. For example, the first output signal SEQ[0] may change from the first logic level to the second logic level at the fourth time point t4, which corresponds to a time point after a certain time period elapses from the second time point t2. The second output signal SEQ[1] may change from the first logic level to the second logic level at the sixth time point t6. The (K+1)-th output signal SEQ[K] may change from the first logic level to the second logic level at a seventh time point t7.

The comparison completion signal CD may repeatedly toggle between the first logic level and the second logic level from the third time point t3, which corresponds to a time point after a certain time period elapses from the second time point t2, to the seventh time point t7. For example, the period of the comparison completion signal CD may correspond to a difference between the third time point t3 and the fifth time point t5.

The first to (K+1)-th enable signals EN[0] to EN[K] may have pulse waveforms, respective pulses of which are sequentially maintained at the second logic level based on pulses of the comparison completion signal CD. For example, the first enable signal EN[0] may have a pulse at the second logic level in synchronization with the first pulse of the comparison completion signal CD. The second enable signal EN[1] may have a pulse at the second logic level in synchronization with the second pulse of the comparison completion signal CD. The (K+1)-th enable signal EN[K] may have a pulse at the second logic level in synchronization with the (K+1)-th pulse of the comparison completion signal CD. A time point at which each of the first to (K+1)-th enable signals EN[0] to EN[K] has a pulse at the second logic level may be synchronized with a respective bit out point BO in FIG. 6.

Figure 12A:
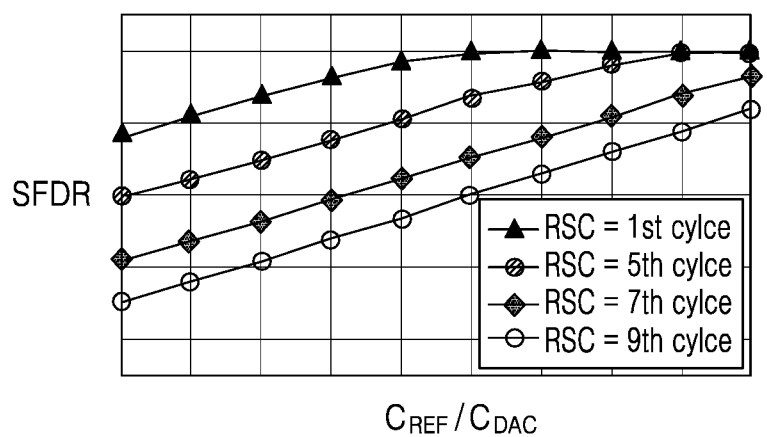
FIGS. 12A and 12B are respectively a graph of a spurious free dynamic range (SFDR) versus a capacitance ratio and a graph of a signal-to-noise and distortion ratio (SNDR) versus the capacitance ratio.
Figure 12B:
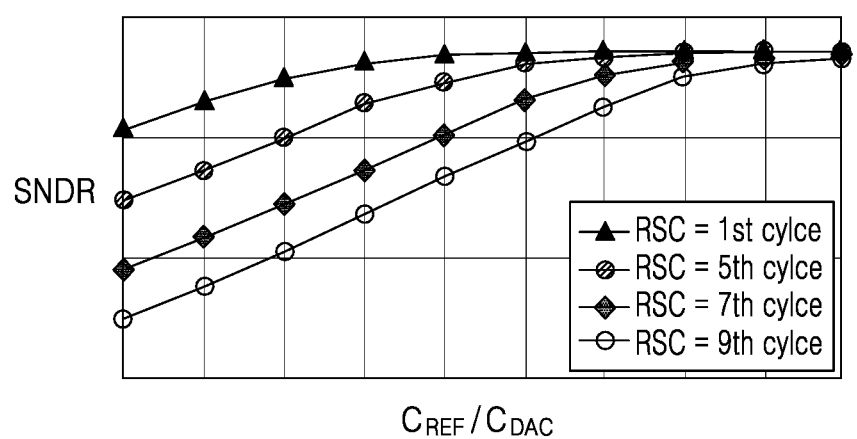

FIG. 12A illustrates a graph of a spurious free dynamic range (SFDR) versus a capacitance ratio, and FIG. 12B illustrates a graph of a signal-to-noise and distortion ratio (SNDR) versus the capacitance ratio.

Referring to FIG. 12A, the horizontal axis is a capacitance ratio between the capacitance of a capacitor of the DAC 130, e.g., the capacitance of the fourth capacitor C4, and the capacitance of the reference capacitor CREF of a second voltage supplier, e.g., the second voltage supplier 122b; and the vertical axis is the SFDR. When the capacitance ratio increases, the SFDR also increases. With respect to a capacitance ratio, the SFDR increases as the value of the switching cycle RSC among N cycles increases.

Referring to FIG. 12B, the horizontal axis is the capacitance ratio described above, and the vertical axis is the SNDR. As the capacitance ratio increases, the SNDR also increases.

According to the descriptions give above, the integration of an analog-to-digital converter may be accomplished by reducing the size of a voltage supplier supplying a reference voltage without performance degradation.

Because condenser switching energy is mostly consumed during multiple MSB conversion cycles, the degree of capacitive reference driver (CRD) drop in a reference voltage may be greatly reduced by using a switched capacitive reference driver (SCRD), for example according to embodiments discussed above. In this case, bit weight correction or compensation requiring an auxiliary capacitive DAC (CDAC) may be not needed.

Figure 13:
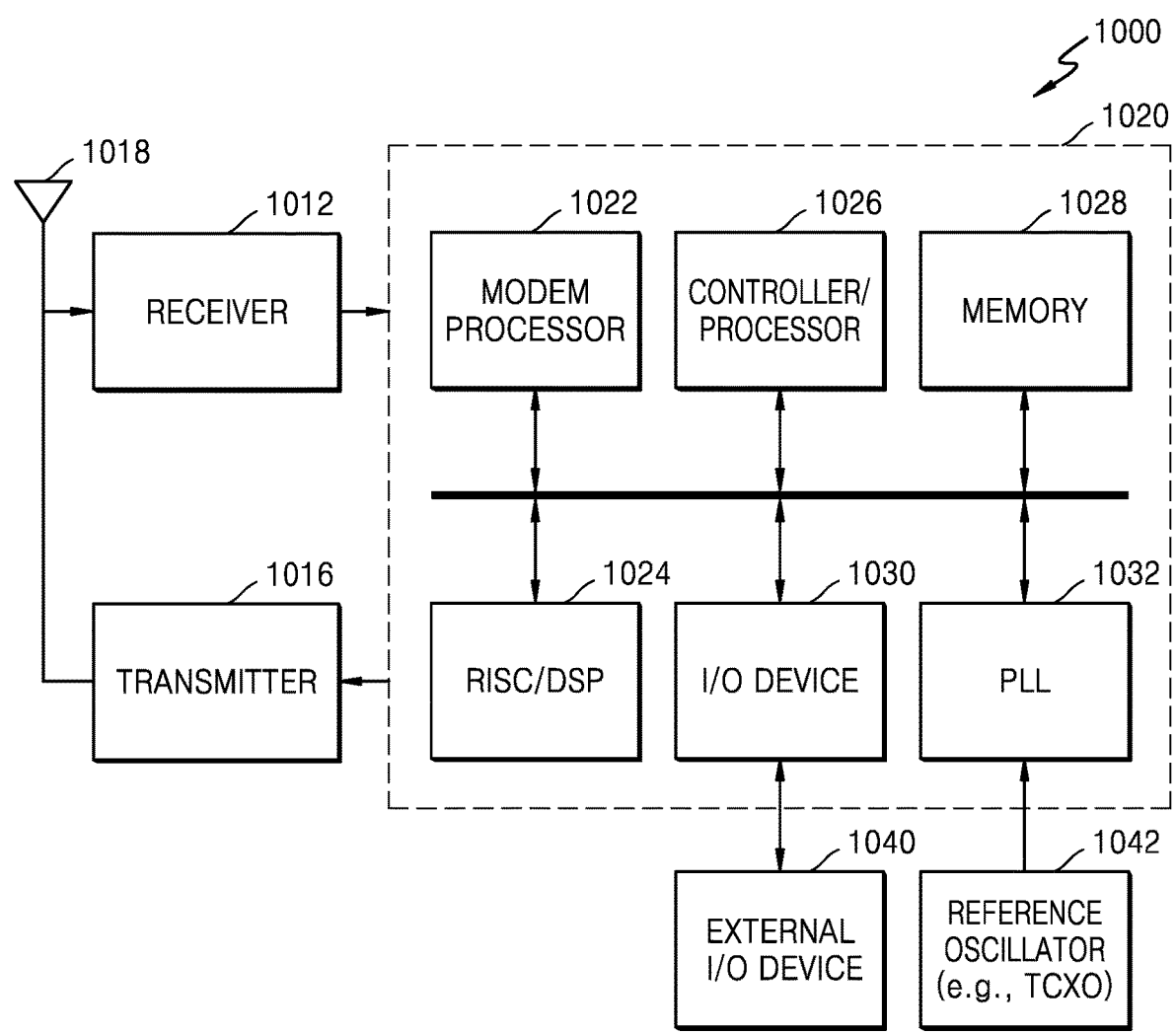
FIG. 13 is a block diagram of a communication device according to an embodiment.

FIG. 13 is a block diagram of a communication device according to an embodiment.

Referring to FIG. 13, a communication device 1000 may include a receiver 1012, a transmitter 1016, a communication module 1020, an antenna 1018, an external input/output (I/O) device 1040, and a reference oscillator 1042. The receiver 1012 may include the analog-to-digital converter 100 of FIG. 1. The receiver 1012 may externally receive an analog signal through the antenna 1018, convert the analog signal into a digital signal using the analog-to-digital converter 100, and provide the digital signal to the communication module 1020. The transmitter 1016 may receive a digital signal from the communication module 1020, convert the digital signal into an analog signal, and output the analog signal through the antenna 1018.

The communication module 1020 may include a modem processor 1022, a reduced instruction set computer (RISC)/digital signal processor (DSP) 1024, a controller/processor 1026, a memory 1028, an I/O device 1030, and a phase-locked loop (PLL) 1032.

The modem processor 1022 may perform processing operations, such as encoding, modulation, demodulation, and decoding, to transmit and receive data. The RISC/DSP 1024 may perform a general or specialized processing operation in the communication device 1000. The controller/processor 1026 may control blocks of the communication module 1020. The memory 1028 may store data and various instructions code. The I/O device 1030 may communicate with the external I/O device 1040. The I/O device 1030 may convert a data signal received from the external I/O device 1040 into a digital signal using the analog-to-digital converter 100. The PLL 1032 may perform frequency modulation using a frequency signal received from the reference oscillator 1042. The reference oscillator 1042 may include a crystal oscillator (XO), a voltage controlled crystal oscillator (VCXO), or a temperature compensated crystal oscillator (TCXO). The communication module 1020 may perform a processing operation, which may be used for communication, using an output signal generated by the PLL 1032.

Figure 14:
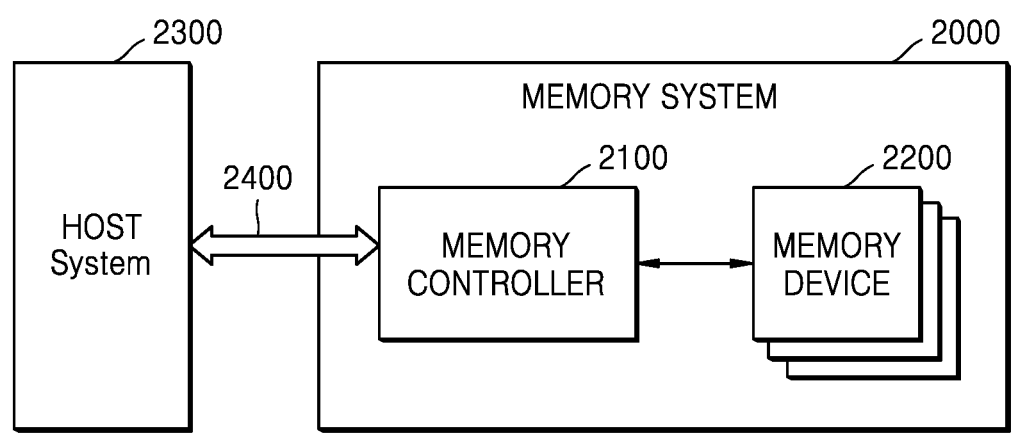
FIG. 14 is a block diagram illustrating systems according to an embodiment.

FIG. 14 is a block diagram illustrating systems according to an example embodiment.

Referring to FIG. 14, a memory system 2000 and a host system 2300 may communicate with each other through an interface 2400. The memory system 2000 may include a memory controller 2100 and memory devices 2200.

The interface 2400 may use an electrical signal and/or an optical signal. As a non-limiting example, the interface 2400 may include a serial advanced technology attachment (SATA) interface, a SATA express (SATAe) interface, a serial attached small computer system interface (SCSI) (SAS), a universal serial bus (USB) interface, or a combination thereof. The host system 2300 and the memory controller 2100 may include a serializer/deserializer (SerDes) for serial communication.

In some embodiments, the memory system 2000 may be removably coupled to the host system 2300 and may communicate with the host system 2300. The memory devices 2200 may include volatile memory or non-volatile memory. The memory system 2000 may be called a storage system. As a non-limiting example, the memory system 2000 may include a solid-state drive or disk (SSD), an embedded SSD (eSSD), a multimedia card (MMC), or an embedded MMC (eMMC). The memory controller 2100 may control the memory devices 2200 in response to a request received from the host system 2300 through the interface 2400.

The analog-to-digital converter 100 according to example embodiments may be included in each of the memory controller 2100, the memory devices 2200, and the host system 2300. In detail, the memory controller 2100, the memory devices 2200, and the host system 2300 may receive a data signal based on pulse amplitude modulation (PAM) and convert the data signal into digital data using the method according to the example embodiments.

Figure 15:
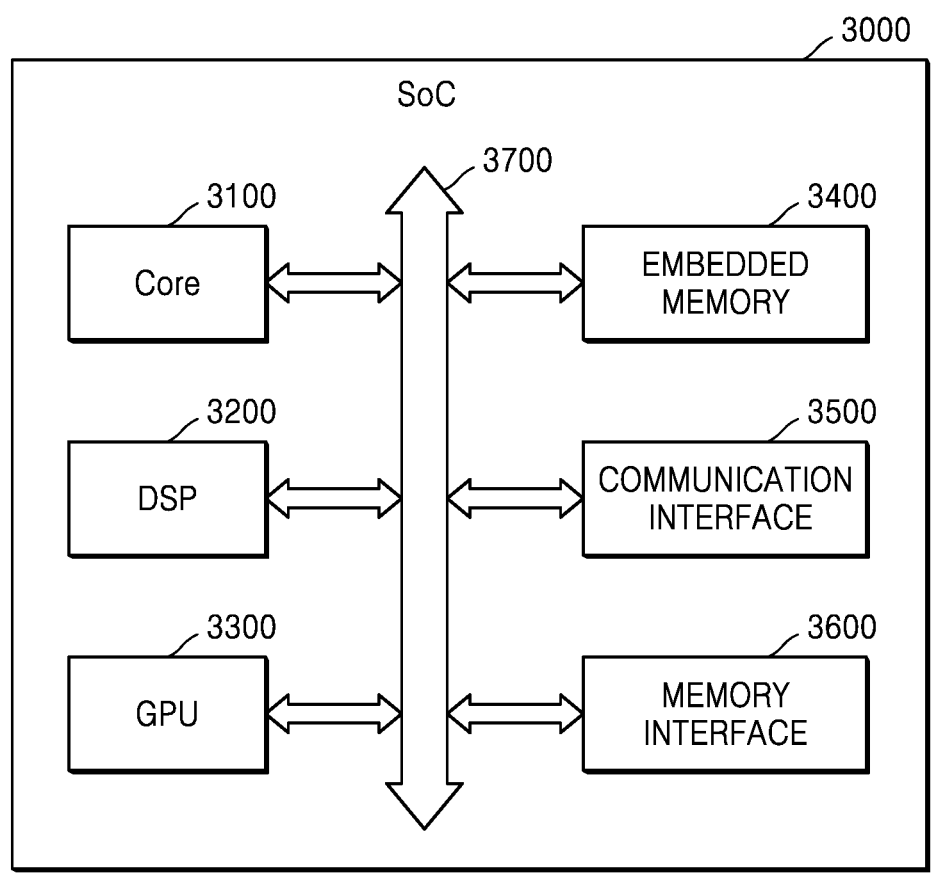
FIG. 15 is a block diagram of a system-on-chip (SoC) according to an embodiment.

FIG. 15 is a block diagram of a system-on-chip (SoC) according to an example embodiment.

An SoC 3000 may refer to an integrated circuit in which components of a computing system or another electronic system are integrated. For example, an application processor (AP) as an example of the SoC 3000 may include a processor and components for other functions.

The SoC 3000 may include a core 3100, a DSP 3200, a graphics processing unit (GPU) 3300, an embedded memory 3400, a communication interface 3500, and a memory interface 3600. The elements of the SoC 3000 may communicate with one another through a bus 3700.

The core 3100 may process instructions and control the operations of the elements of the SoC 3000. For example, the core 3100 may drive an operating system (OS) by processing a series of instructions and execute applications on the OS. The DSP 3200 may generate useful data by processing a digital signal, for example, provided from the communication interface 3500. The GPU 3300 may generate data, which corresponds to an image output through a display device, from image data provided from the embedded memory 3400 or the memory interface 3600 or may encode the image data. The embedded memory 3400 may store data necessary for the operations of the core 3100, the DSP 3200, and the GPU 3300. The memory interface 3600 may provide an interface for an external memory of the SoC 3000, e.g., dynamic random access memory (DRAM) or flash memory.

The communication interface 3500 may provide serial communication with the outside of the SoC 3000. For example, the communication interface 3500 may access Ethernet and include a SerDes for serial communication.

The analog-to-digital converter 100 according to the example embodiments may be applied to the communication interface 3500 or the memory interface 3600. In detail, the communication interface 3500 or the memory interface 3600 may receive a data signal based on PAM and convert the data signal into digital data using the method according to the example embodiments.

While embodiments have been particularly shown and described, it will be understood that various changes in form and details may be made therein without departing from the spirit and scope of the following claims.

What is claimed is:

1. An analog-to-digital converter, comprising:
a sample/hold circuit;
a reference voltage driver;
a digital-to-analog converter;
a comparator; and
a logic circuit,
wherein the reference voltage driver includes:
a first voltage supplier circuit configured to output an external supply voltage provided from outside of the analog-to-digital converter;
a second voltage supplier circuit configured to output a sampled reference voltage that is obtained during a sampling phase based on control signals received from the logic circuit; and
a switching driver configured to electrically connect the first voltage supplier circuit to the digital-to-analog converter during a first conversion phase after the sampling phase based on the control signals received from the logic circuit, and to electrically connect the second voltage supplier circuit to the digital-to-analog converter during a second conversion phase based on the control signals received from the logic circuit.

2. The analog-to-digital converter of claim 1, wherein the first voltage supplier circuit includes a low-dropout (LDO) regulator configured to regulate the external supply voltage.

3. The analog-to-digital converter of claim 1, wherein the second voltage supplier circuit includes:
a reference capacitor connected between a first node and a second node, wherein the first node is connected to the switching driver, and a ground voltage is applied to the second node; and
a switch connected between a third node and the first node, wherein an external reference voltage is supplied from the outside of the analog-to-digital converter and is applied to the third node,
wherein the switch is configured to turn on during the sampling phase.

4. The analog-to-digital converter of claim 3, wherein the digital-to-analog converter includes a capacitor having a first capacitance, and
wherein the reference capacitor has a second capacitance that is greater than the first capacitance.

5. The analog-to-digital converter of claim 1, wherein the second voltage supplier circuit includes:
a reference metal-oxide-semiconductor (MOS) capacitor connected between a first node and a second node, wherein the first node is connected to the switching driver, and a ground voltage is applied to the second node; and
a switching transistor connected between a third node and the first node, wherein an external reference voltage is supplied from the outside of the analog-to-digital converter and is applied to the third node,
wherein the switching transistor is configured to turn on during the sampling phase.

6. The analog-to-digital converter of claim 5, wherein the digital-to-analog converter includes a capacitor having a first capacitance, and
wherein the reference MOS capacitor has a second capacitance that is greater than the first capacitance.

7. The analog-to-digital converter of claim 1, wherein the switching driver includes:
a first transistor connected between the first voltage supplier circuit and a node connected to the digital-to-analog converter, wherein the first transistor is configured to turn on based on a control signal received from the logic circuit;
an inverter configured to receive the control signal and output an inverted control signal; and
a second transistor connected between the second voltage supplier circuit and the node, and configured to turn on based on the inverted control signal.

8. The analog-to-digital converter of claim 1, wherein the first conversion phase occurs after the sampling phase and before the second conversion phase, and a length of the first conversion phase is greater than or equal to a length of the second conversion phase.

9. An analog-to-digital converter comprising:
a sample/hold circuit configured to sample a first input voltage and a second input voltage based on a sample/hold control signal;
a reference voltage driver configured to output a reference voltage;
a digital-to-analog converter configured to, based a conversion control signal, output a first comparison voltage based on a sampled first input voltage and the reference voltage, and output a second comparison voltage based on a sampled second input voltage and the reference voltage;

a comparator configured to compare the first comparison voltage with the second comparison voltage based on a comparison control signal, and to output a comparison result voltage and a comparison completion signal; and a logic circuit configured to output the sample/hold control signal, a switching control signal, the conversion control signal, and the comparison control signal, and to output a digital signal based on the comparison result voltage, wherein the switching control signal has a first logic level during a sampling phase and a first conversion phase and a second logic level during a second conversion phase that occurs after the first conversion phase, wherein the reference voltage driver is further configured to output the reference voltage to the digital-to-analog converter as one from among a sampled reference voltage or a supply voltage, based on a logic level of the switching control signal, and wherein the sampled reference voltage is obtained during the sampling phase, and the supply voltage is provided from an outside of the analog-to-digital converter.

10. The analog-to-digital converter of claim 9, wherein the reference voltage driver includes a first transistor, a second transistor, a third transistor, a fourth transistor, a fifth transistor, and an inverter, wherein the comparison result voltage is applied to a gate electrode of the first transistor, and the supply voltage is applied to a first electrode of the first transistor, wherein the switching control signal is applied to a gate electrode of the second transistor, and a first electrode of the second transistor is connected to a second electrode of the first transistor;

the comparison result voltage is applied to a gate electrode of the third transistor, the sampled reference voltage is applied to a first electrode of the third transistor, and a second electrode of the third transistor is connected to the digital-to-analog converter;

wherein an inverted switching control signal is applied to a gate electrode of the fourth transistor, a first electrode of the fourth transistor is connected to the second electrode of the third transistor, and a second electrode of the fourth transistor is connected to the digital-to-analog converter;

wherein the comparison result voltage is applied to a gate electrode of the fifth transistor, and the fifth transistor is connected between the fourth transistor and a ground voltage; and wherein the inverter is configured to receive the switching control signal and output the inverted switching control signal.

11. The analog-to-digital converter of claim 10, wherein the reference voltage driver further includes:

a reference capacitor connected between a first node and a second node, wherein the first node is connected to the first electrode of the third transistor, and the ground voltage is applied to the second node; and a switch connected between the first node and a third node to which an external supply voltage is applied, wherein the switch is configured to electrically connect the third node to the first node based on a turn-on level of the sample/hold control signal.

12. The analog-to-digital converter of claim 10, wherein the reference voltage driver further includes:

a reference metal-oxide-semiconductor (MOS) capacitor connected between a first node and a second node, wherein the first node is connected to the first electrode of the third transistor, and the ground voltage is applied to the second node; and a switching transistor, wherein the sample/hold control signal is applied to a gate electrode of the switching transistor, a first electrode of the switching transistor is connected to the first node, and a second electrode of the switching transistor is connected to a third node to which an external supply voltage is applied.

13. The analog-to-digital converter of claim 9, wherein the sample/hold control signal has the second logic level during the sampling phase and the first logic level during the first conversion phase and the second conversion phase.

14. The analog-to-digital converter of claim 13, wherein the comparison control signal includes a clock signal having a certain period during the first conversion phase and the second conversion phase.

15. The analog-to-digital converter of claim 14, wherein the comparison control signal has a plurality of cycles, and wherein a number of the plurality of cycles during the first conversion phase is greater than or equal to a number of the plurality of cycles during the second conversion phase.

16. The analog-to-digital converter of claim 15, wherein the logic circuit includes:

an enable circuit configured to output an enable signal based on the sample/hold control signal and the comparison completion signal;

a latch configured to latch the enable signal based on the sample/hold control signal and the enable signal, and to output an inverted signal; and a logic gate configured to perform a logical OR operation on the enable signal and the inverted signal, and to output the switching control signal based on the logical OR operation.

17. The analog-to-digital converter of claim 16, wherein the enable circuit includes:

a first flip-flop configured to receive an inverted sample/hold control signal as a first data input and an inverted comparison completion signal as a first clock input, and to output a first output signal, the inverted sample/hold control signal, and the inverted comparison completion signal; and a first logic operation circuit configured to output a first enable signal based on the inverted sample/hold control signal, the comparison completion signal, and a first inverted output signal.

18. The analog-to-digital converter of claim 17, wherein the first logic operation circuit includes:

a first logic gate configured to perform a first logical AND operation on the first inverted output signal and the inverted sample/hold control signal, and to output a first operation result signal based on the first logical AND operation; and a second logic gate configured to perform a second logical AND operation on the first operation result signal and the comparison completion signal, and to output a second operation result signal as the first enable signal based on the second logical AND operation.

19. The analog-to-digital converter of claim 18, wherein the enable circuit further includes:

a second flip-flop configured to receive the first output signal as a second data input and the inverted comparison completion signal as a second clock input, and to output a second output signal; and a second logic operation circuit configured to output a second enable signal based on the first output signal, the comparison completion signal, and a second inverted output signal.

20. An analog-to-digital converter, comprising:
a digital-to-analog converter;
a logic circuit; and
a reference voltage driver, wherein the reference voltage driver includes:
  a first voltage supplier circuit configured to output an external supply voltage;
  a second voltage supplier circuit configured to output a sampled reference voltage that is obtained during a sampling phase based on control signals received from the logic circuit; and
  a switching driver configured to:
    provide the external supply voltage from the first voltage supplier circuit to the digital-to-analog converter during a first conversion phase that occurs after the sampling phase based on the control signals received from the logic circuit, and
    provide the sampled reference voltage from the second voltage supplier circuit to the digital-to-analog converter during a second conversion phase based on the control signals received from the logic circuit.

* * * * *